United States Patent
Yin

[11] Patent Number: 5,898,717
[45] Date of Patent: Apr. 27, 1999

[54] THIRD HARMONIC GENERATION APPARATUS

[75] Inventor: Yusong Yin, Stony Brook, N.Y.

[73] Assignee: Photonics Industries International, Inc., Stony Brook, N.Y.

[21] Appl. No.: 08/788,772

[22] Filed: Jan. 24, 1997

[51] Int. Cl.$^6$ ...................................................... H01S 3/10
[52] U.S. Cl. ............................................................ 372/22
[58] Field of Search .............................. 372/22; 359/328

[56]         References Cited

U.S. PATENT DOCUMENTS

| | | |
|---|---|---|
| 4,048,515 | 9/1977 | Liu . |
| 4,618,957 | 10/1986 | Liu . |
| 4,637,026 | 1/1987 | Liu . |
| 5,144,630 | 9/1992 | Lin ............................................. 372/22 |
| 5,206,868 | 4/1993 | Deacon .................................... 372/22 |
| 5,297,156 | 3/1994 | Deacon .................................... 372/22 |
| 5,361,268 | 11/1994 | Fossey et al. ............................ 372/22 |

Primary Examiner—Rodney B. Bovernick
Assistant Examiner—Robert E. Wise
Attorney, Agent, or Firm—James A. Quinton, Esq.

[57]             ABSTRACT

Third harmonic generated from intra-cavity frequency tripled resonator is disclosed in which type II phase matching crystal is used as the tripler. Type I phase matching is used for second harmonic generation. The resonator efficiently converts the fundamental laser frequency to its third harmonic laser beam. The laser is highly efficient with high third harmonic output stability. Overall conversion efficiency exceeds 25% and preferably is 50% or higher.

20 Claims, 3 Drawing Sheets

THIRD HARMONIC GENERATION APPARATUS

BACKGROUND OF THE INVENTION

1. Field of the Invention

The field of the invention concerns a frequency tripled laser, and in particular a method and apparatus for generating a frequency tripled beam.

2. Background of the Invention

Optical harmonic generation using a non-linear medium such as a crystal, provides a method for doubling, tripling or more generally producing the Nth harmonic of the frequency of electromagnetic radiation emitted by a laser or other high intensity source. The third harmonic is produced by sum frequency generation of the laser fundamental and its second harmonic beams through second order nonlinearities of the nonlinear medium (p $(\omega)=\eta_0(3)*P_0(\omega)*P_0(2\omega)$). The common third harmonic generation method, which is known in the art, combines the fundamental and the second harmonic beam in a nonlinear crystal to generate its third harmonic in the external laser cavity. For a high power laser, typical efficiency is limited to less than 25% overall conversion efficiency, since unconverted fundamental beam and second harmonic beam are wasted in that configuration. The overall conversion efficiency $\eta=P(3\omega)/P_0(\omega)=\eta_0(3\omega)*\eta_1(2\omega)P_0^2(\omega)-\eta_1(2\omega)P_0^2(\omega))$ is less than 25% for even very high power pulsed Nd:YAG lasers (see Continuum Products brochures).

The theory of intra-cavity second harmonic generation (SHG) has been discussed by R. G. Smith, *I.E.E.E. Journal of Quantrum Electr.* QE-6, 215–223 (1970). Franken and Ward, in *Rev. Mod. Phys.* 35 23 (1963) has noted that a crystalline medium can produce a second harmonic of the frequency of the incident radiation only if the crystal lacks inversion symmetry so that the second order polarization tensor $d^{ij}$ in the lowest order non-linear polarization term does not vanish. If the crystal has inversion symmetry, the lowest order non-linear polarization contribution is cubic in the electric field strengths, and this crystal will produce only third or higher harmonics of the initial frequency. Beam or parametric production of harmonics has been demonstrated in crystals such as $LiNbO_3$, $BaNa(NbO_3)$; $LiO_3$, KDP, $KTiOPO_4$, BBO and $LiB_3O_5$. $LiB_3O_5$ is also referred to as LBO crystal.

SUMMARY OF THE INVENTION

According to the invention a third harmonic frequency generating method and apparatus is provided. The system includes within the optical cavity an active laser medium, a second harmonic generator for generating second harmonic frequency of the fundamental frequency emitted by the laser, a third harmonic generator for generating third harmonic frequency of the fundamental frequency, and a wavelength selective coupling to facilitate the removal of the third harmonic from the optical cavity. Optionally the unconverted second harmonic beam can be directed through the laser medium as additional pumping. The resulting laser has a conversion efficiency of 25% or greater and preferable 50% or more.

Useful in this invention are a type I phase matching crystal for second harmonic generation and a type II phase matching crystal for third harmonic generation. In a type I phase matching crystal for second harmonic generation, the fundamental beam is polarized perpendicular to the crystals axis (an O or ordinary ray) and the generated second harmonic beam is polarized parallel to the optic axis (an E or extraordinary beam). In a type II phase matching crystal for third harmonic generation, the fundamental beam and second harmonic beam are orthogonal polarized and produce a third harmonic beam with its polarization parallel to the polarization of one of two input beams (for example in a type II LBO crystal the polarization of the fundamental beam and the third harmonic beam will be parallel).

It is an object of the invention to provide efficient intra-cavity generation of optical third harmonic frequencies of light or radiation, using a nonlinear crystal or crystals or other conversion means positioned within the optical cavity containing the active laser medium.

It is an object of the invention to provide laser frequency tripling apparatus by using type I and type II nonlinear crystal combination within the laser cavity.

It is an object of the invention to provide frequency tripling apparatus with overall conversion efficiency of 25% or more (tripled output power/total fundamental output power).

It is an object of the invention to provide high output of tripled frequency beam in ultraviolet.

It is an object of the invention to increase third harmonic conversion efficiency by redirecting second harmonic frequency beam to pump the laser medium.

Other and further objects will become apparent from the specification, drawings and claims.

The preferred embodiment of the present invention is illustrated in the drawings and examples. However, it should be expressly, understood that the present invention should not be limited solely to the illustrative embodiment.

DETAILED DESCRIPTION OF THE INVENTION

According to the invention, a frequency tripled laser is provided which includes a first and second mirror which form an optical resonator cavity. An efficient intra-cavity third harmonic frequency generating laser is provided with a conversion efficiency of 25 to 50 percent preferably 50% or greater. A laser medium preferably a solid state laser medium is located within the optical cavity to generate a fundamental beam of electromagnetic radiation having a preselected wavelength propagating from the front and back end of the laser medium. A second harmonic generator located within the optical cavity is provided for converting a portion of the fundamental beam to a second harmonic wave length beam. The second harmonic generator includes a type I frequency doubling nonlinear crystal. A type II frequency tripling nonlinear crystal is also located within the laser cavity. The fundamental wave length beam from the laser is directed through the type I frequency doubling crystal within the optical cavity. As a result a portion of the fundamental beam is converted to second harmonic wave length. The fundamental and second harmonic beams are reflected back through the type I crystal optionally in phase where the first harmonic beam is again partially converted to second harmonic. The resulting fundamental beam and second harmonic beam are then directed to a type II frequency tripling nonlinear crystal which converts a portion of the fundamental beam and a substantial portion of the second harmonic to a third harmonic frequency when both fundamental and second harmonic beams propagate through the type II crystal. The resulting beams which are the fundamental, second harmonic and third harmonic are then directed to a third harmonic separator in which the third harmonic beam is separated from the fundamental beam and directed outside the optical cavity as the output of the laser. The fundamental beam is then directed back through the laser medium and is amplified. Preferably both the fundamental and the unconverted second harmonic beams are directed back through the laser medium to increase its efficiency. A mirror is provided at the back end of the laser medium to reflect back to the laser medium energy exiting the back of the laser medium.

Figure 1:
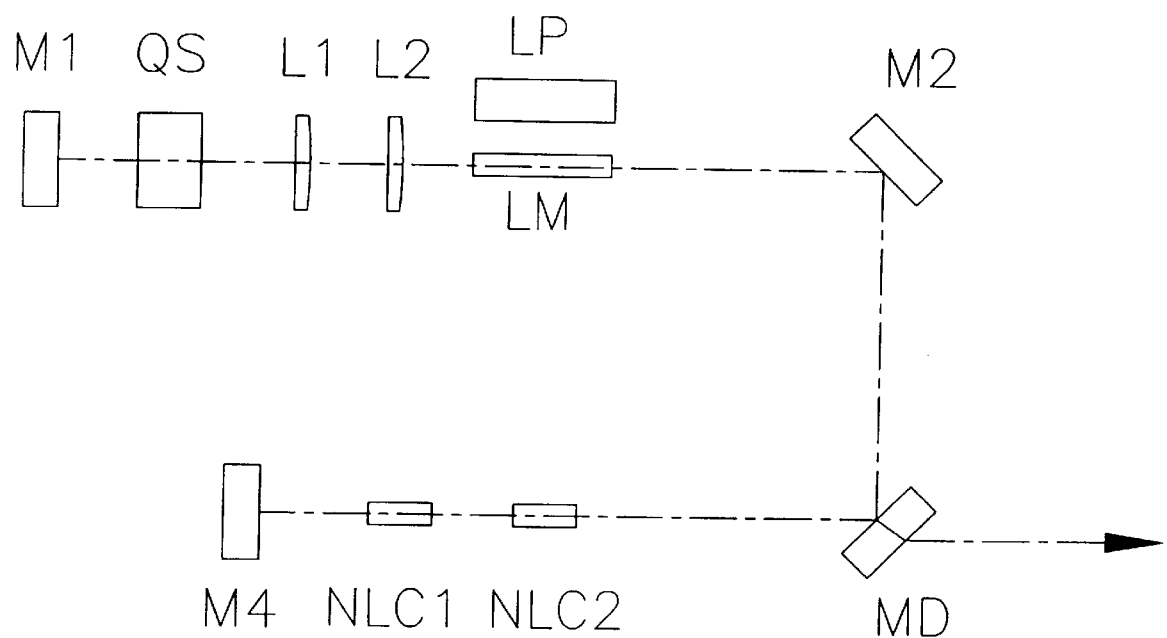
FIG. 1 is a diagrammatic view of a laser according to the invention.

Referring now to FIG. 1, a frequency tripled laser is provided. A lasing material LM is provided. A number of different lasing mediums can be used for example Nd:YLF, Nd:YAG, Nd:YVO$_4$. A laser pump LP for example a lamp, laser diodes or another laser is provided to energize the lasing medium. Mirrors M1 and M4 are provided to define the optical cavity. Optionally between mirror M1 and lasing material LM, a Q switch can be provided in the event a pulsed laser output is desired instead of a continuous wave output. Optionally, spherical lens L2 and cylindrical lens L1 are provided particular with an Nd:YLF crystal. The spherical lens adjust the spot size of the beam. The cylindrical lens compensates for thermal lensing characteristics of the crystal particularly of an Nd: YLF crystal. In the Q switch option, the laser is held off by introducing a loss into the resonator cavity while energy is pumped into and stored in the atomic population inversion. Once desired inversion is attained, cavity losses are reduced to allow lasing. In this mode, it is possible to produce large pulse chain output from the laser. Mirror M1 is a high reflector mirror for the fundamental frequency of the lasing medium LM. The laser medium is selected to generate a laser beam at a preselected fundamental frequency along a common axis 1. Preferable as shown in FIG. 1 the optical axis is generally u-shaped. A beam is propagates from both the front of the laser medium and from the back of the laser medium towards Mirror M1. For example an Nd:YLF laser medium can be used which emits a beam having a wave length of 1053 nm. According to the invention, a second harmonic beam having a wave length of 527 nm and third harmonic beam in the UV spectrum having a wave length of 351 nm will be produced.

A mirror M2 which is a high a reflector for the fundamental frequency of the laser medium LM and optionally a high reflector for the second harmonic frequency is provided in optical communication with output from the front end of the lasing medium, LM. Desirable mirror M2 is a folding mirror. A mirror MD is provided in optical communication with M2. MD is a high reflector for beams having the preselected fundamental frequency and high transmission for third harmonic frequency beam. Desirably MD is a dichroic mirror. Optionally MD is also a high reflector for second harmonic wave length beams. A type II nonlinear crystal for third harmonic generation NLC2 preferably a type II lithium triborate crystal (LBO) is provided in optical communication with beams reflected by mirror MD. The output of NLC2 is directed to a type I nonlinear crystal NLC1 for second harmonic generation preferably a type I LBO crystal. The output of NLC1 is directed to mirror M4 which is a high reflector for both fundamental frequency and second harmonic frequency beams.

The fundamental beam from the laser medium LM is reflected by M1 and amplified by LM along the fundamental optical axis "1". The beam then incidents on mirror M2. M2 preferably reflects vertical polarized fundamental beam to Mirror MD and transmits horizontal polarized fundamental beam. As a result vertical polarized beams are favored and horizontal polarized beams are discouraged. Thus laser material LM lases at vertical polarization. Optionally M2 can reflect horizonatally polarized fundamental beam and transmit vertically polarized fundamental beam. The laser material will then laser at horizontal polarization. Mirror MD directs the reflected beam from Mirror M2 to Crystal NCL2. The fundamental beam 1 passes NLC2 and incidents on NLC1. Since type II crystal NLC2 only converts a fundamental beam to a third harmonic beam in the presence of the second harmonic beam, the fundamental beam is unaffected on this pass through NLC2. A small portion of the fundamental beam (beam 1) converts to the horizontal polarized second harmonic beam (beam 2) through NLC1 by meeting its phase matching condition (K(2w)=K(w)+K(w) either through critical phase matching (orientation of the crystal) or noncritical phase matching (temperature tuning). Both beam 1 and beam 2 propagate toward the mirror M4 and are reflected back from the same mirror. When the beam 1 passes through the NLC1 on reflection from the Mirror M4, another small portion of the fundamental beam converts to its second harmonic beam which is superimposed with the reflected second harmonic beam 2 to form a combined second harmonic beam 2. The crystal NLC2 converts a portion of fundamental beam 1 and a substantial portion of second harmonic beam 2 propagating from NLC1 into the third harmonic beam (beam 3) under the satisfaction of phase matching condition k(3w)=½ (K(w)+k(2w)). The beams 1, 2, 3 are directed to Mirror MD. Preferably MD removes third harmonic beam from the cavity, and reflects beam 1 and preferably beam 2 toward Mirror M2. Optionally, both beam 2 and 3 that is the second harmonic and third harmonic can be removed together from the cavity. The fundamental beam 1 reflected back from Mirror M2 is amplified by the laser Medium LM. Mirror M2 is preferably reflective for second harmonic wave length beam. This beam 2 is reflected back from M2 and pumps LM to increase pumping efficiency. The beam spot size on the crystal NLC1 and NLC2 is desirably one half or less than the diameter of the crystal.

The resulting laser has an improved efficiency. An overall conversion of fundamental to third harmonic of over 25% is achieved. Preferably an efficiency of from about 25% to about 50% is achieved and most preferably a conversion efficiency of over about 50% is achieved. The overall conversion efficiency is calculated by dividing the tripled frequency output power by total fundamental frequency output power under the condition of no second harmonic frequency and third harmonic frequency generations. For example typically a prior art Nd:YLF laser produces total 12 watts power at the fundamental frequency at Q-switched 1000 Hz repetition rate at 150 nanosecond pulse width. With the same laser, a total 2 watts or less watts of tripled frequency power is generated from the laser. The overall conversion efficiency is less than 17%. According to the invention, a laser Nd:YLF as shown in FIG. 1 produces 6.8 watts frequency tripled output in ultraviolet wavelength from a 12 watts fundamental frequency power at 1000 Hz repetition rate. The conversion efficiency is about 57%.

Figure 2:
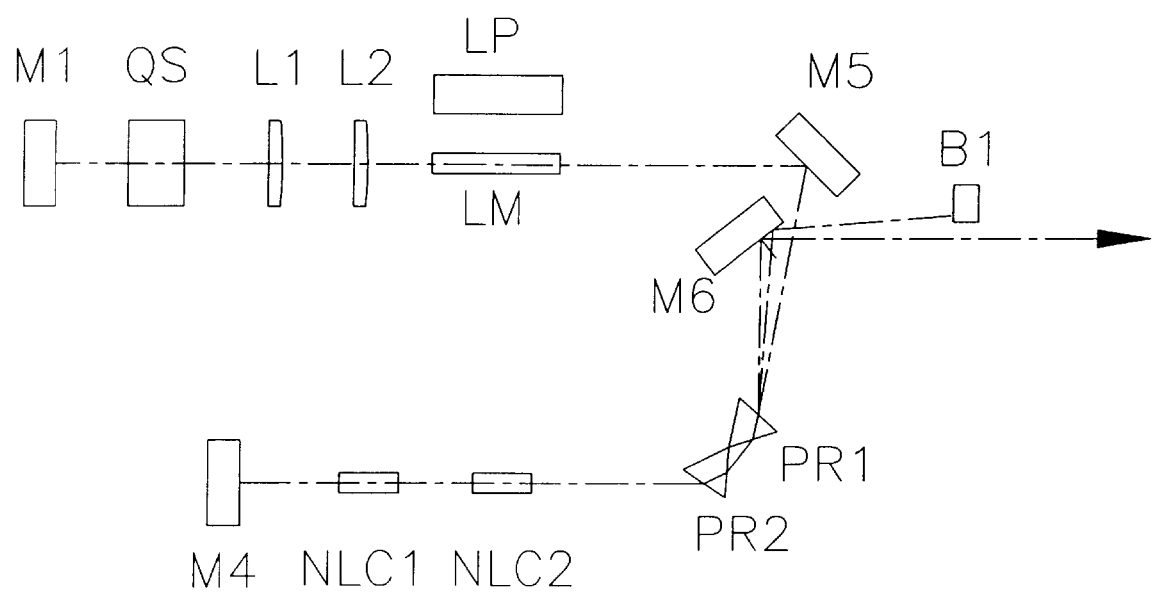
FIG. 2 is a diagrammatic view of an alternative embodiment of the laser according to the invention.

Referring to FIG. 2, an alternative embodiment of a laser according to the invention in which a pair of prisms PR1 and PR2 preferably UV graded fused silica prisms are used to separate the third harmonic beam from the fundamental beam is shown. The fundamental beam from laser medium LM is directed to Mirror M5 which is a high reflector for fundamental beam. The fundamental beam is reflected to Prism PR1 and PR2 which deflects the fundamental beam and directs it to NLC2. The beam passes through NLC2, NLC1 and is reflected by Mirror M4 as described regarding to FIG. 1. The fundamental, second and third harmonic beams then enter prism PR2 where the beams are displaced from one to another. The displaced beams enter prism PR1 which increases the displacement between the beams. The fundamental beam leaving PR1 is directed to mirror M5 and reflected back to LM. The second and third harmonic beams are directed to Mirror M6 which is reflective for third harmonic and second harmonic beam and reflects the beams outside the laser cavity. Preferably a second harmonic beam block B1 is provided to block the second harmonic beam from the output.

Figure 3:
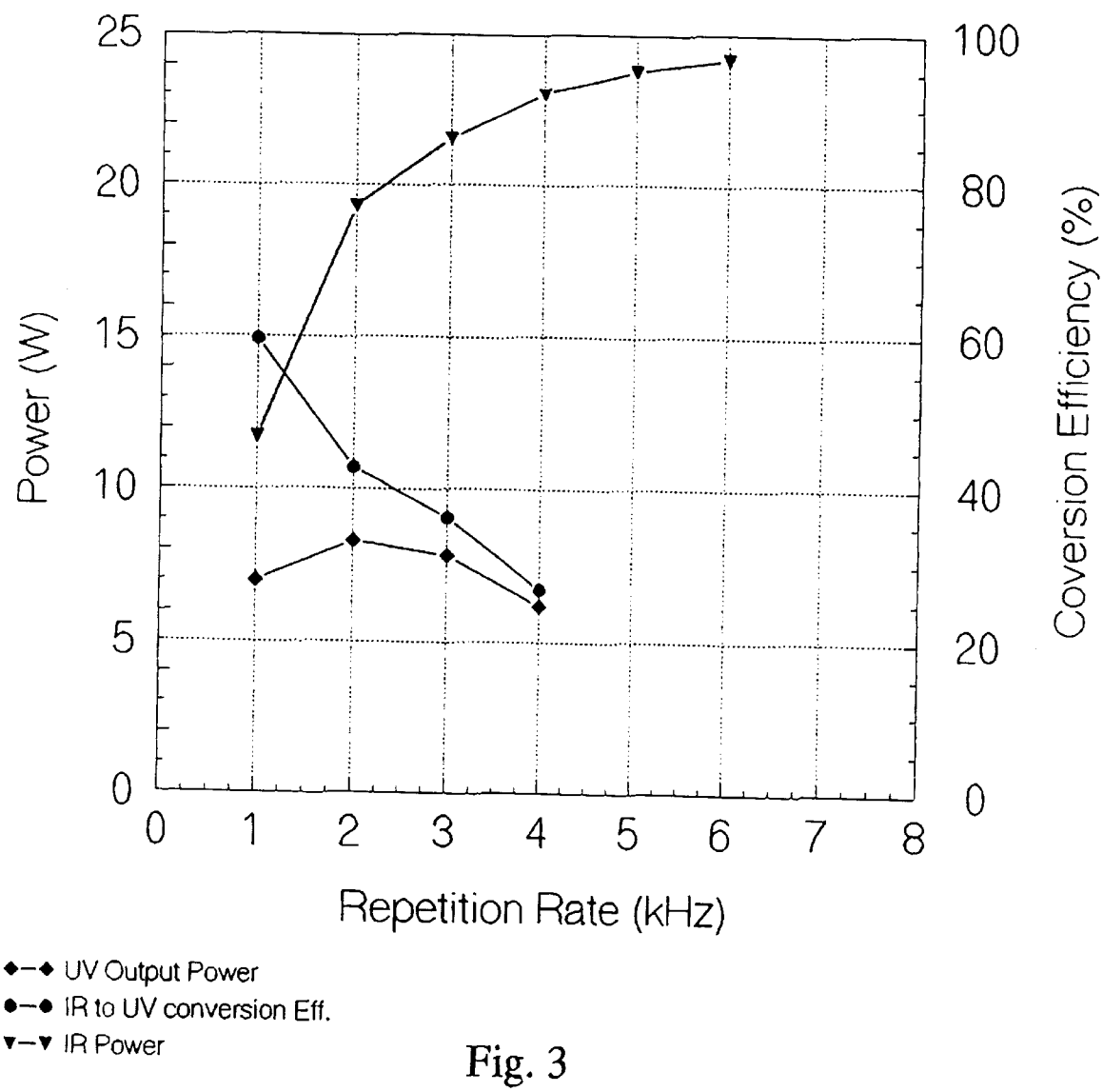
FIG. 3 is a graph of third harmonic conversion efficiency according to the invention.

FIG. 3 shows graphical representation of the benefits of the invention. In FIG. 3, IR output power is plotted against pulse repetition rate. UV output power is plotted against pulse repetition rate for lasers according to the invention. Infrared conversion efficiency is plotted against pulse repetition rate according to the invention. It can be seen from FIG. 3 that a conversion efficiency of from over 25% to 50% or greater can be obtained according to the invention.

The foregoing is considered as illustrative only to the principles of the invention. Further, since numerous changes and modification will occur to those skilled in the art, it is not desired to limit the invention to the exact construction and operation shown and described above, and accordingly, all suitable modifications and equivalents may be resorted to, falling within the scope of the invention.

I claim:

1. A frequency tripled laser comprising
    a) a first mirror and a second mirror to form an optical resonator cavity therebetween;
    b) a laser medium located within said cavity for generating a fundamental frequency beam of electromagnetic radiation (EMR) having a first preselected wave length propagating from the front end and the back end of said laser medium;
    c) second harmonic generating means for converting a portion of said EMR of said first preselected fundamental wave length beam to a second harmonic beam in optical communication with said front end of said laser medium;
    d) said second harmonic generating means including a type I second harmonic generation nonlinear crystal having a first EMR port for receiving and directing radiation through said crystal and a second EMR port for receiving and directing radiation through said crystal whereby radiation will enter said first Emr port, propagate through said crystal and exit said second Emr port and vis versa;
    e) means to direct said fundamental beam and said second harmonic beam from second Emr port to said second mirror to reflect said fundamental and said second harmonic beams to said second EMR port for propagation back through said type I non-linear crystal;
    f) means to direct the EMR propagating from said first EMR port to a third harmonic generating means;
    g) said third harmonic generating means including a type II third harmonic generation nonlinear crystal having a third EMR port for receiving and directing radiation through said crystal and a fourth EMR port for receiving and directing radiation through said crystal whereby radiation will enter said third EMR port, propagate through said crystal and exit said fourth EMR port and vise versa whereby a portion of the fundamental and a portion of second harmonic beams are converted to a third harmonic beam;
    h) a third harmonic beam separation means in optical communication with said fourth EMR port to separate said third harmonic beams from said fundamental beam;
    i) means to direct the separated third harmonic beam outside said optical resonator cavity;
    j) directing means to direct said fundamental beam back through said laser medium; and
    k) said first mirror in optical communication with EMR propagating from the back end of said laser medium to reflect said EMR back through said laser medium.

2. The laser of claim 1 wherein said laser medium is a solid state laser medium.

3. The laser of claim 1 wherein the laser medium is selected from the group consisting of Nd:YLF, Nd:YAG, Nd:YVO$_4$.

4. The laser of claim 3 wherein the laser medium is Nd:YLF.

5. The laser of claim 1 wherein the type I second harmonic generation nonlinear type I crystal is LBO (lithium triborate).

6. The laser of claim 5 wherein the laser fundamental frequency beam is focused and incident on the type I LBO crystal to a diameter of less than half of the diameter of the LBO crystal.

7. The laser of claim 1 wherein the type II third harmonic generation nonlinear crystal is LBO (lithium triborate).

8. The laser of claim 7 wherein the laser fundamental frequency beam and the second harmonic beam are focused and incident on the type II crystal to a diameter of less than half of the diameter of the LBO crystal.

9. The laser of claim 1 wherein the third harmonic beam separation means is a dichroic mirror which reflects the fundamental frequency beam and transmits third harmonic beam.

10. The laser of claim 1 wherein the third harmonic beam separation means is a dichroic mirror which reflects both the fundamental beam and second harmonic beam and transmits the third harmonic beam.

11. The laser of claim 1 wherein the third harmonic beam separation means includes a pair of fused silica prisms for producing a displacement between the fundamental beam and third harmonic beam.

12. The laser of claim 1 further comprising a third mirror located between said laser medium and said second harmonic generating means, said third mirror reflective for vertically polarized fundamental beam and transmissive for horizontally polarized fundamental beam so that said laser medium produces a vertically polarized fundamental laser beam.

13. The laser of claim 1 wherein in (j) said direction means directs both fundamental beam and second harmonic beam back to the laser medium.

14. The laser of claim 1 further comprising a Q-switch for Q-switching the fundamental frequency beam.

15. The laser of claim 1 wherein the third harmonic output has an overall conversion efficiency more than about 25% the fundamental frequency output.

16. The laser of claim 15 wherein the third harmonic output has the overall conversion efficiency of at least about 50% of the fundamental frequency output.

17. The laser of claim 15 wherein the third harmonic output has the overall conversion efficiency of at least about 50% from more than about 25% to about 50% of the fundamental output.

18. The laser of claim 1 wherein said third harmonic beam separation means separates with said fundamental beam and said second harmonic beam from said third harmonic beam.

19. The laser of claim 1 wherein said third harmonic beam separating means separates fundamental beam from second and third harmonic beam; and said second and third harmonic beams are transmitted outside the optical resonator cavity.

20. The laser of claim 1 further comprising a third mirror located between said laser medium and said second harmonic generation means; said mirror highly reflective for horizontally polarized fundamental beam and transmissive for vertically polarized fundamental beam so that the laser produces horizontally polarized fundamental laser beam.

* * * * *